US007997695B2

(12) United States Patent
Shimada

(10) Patent No.: US 7,997,695 B2
(45) Date of Patent: Aug. 16, 2011

(54) LIQUID EJECTING HEAD, LIQUID EJECTING APPARATUS, AND ACTUATOR

(75) Inventor: Masato Shimada, Chino (JP)

(73) Assignee: Seiko Epson Corporation, Tokyo (JP)

( * ) Notice: Subject to any disclaimer, the term of this patent is extended or adjusted under 35 U.S.C. 154(b) by 161 days.

(21) Appl. No.: 12/413,417

(22) Filed: Mar. 27, 2009

(65) Prior Publication Data

US 2009/0244213 A1 Oct. 1, 2009

(30) Foreign Application Priority Data

Mar. 27, 2008 (JP) ................................ 2008-082880

(51) Int. Cl.
*B41J 2/045* (2006.01)
*H01L 41/00* (2006.01)

(52) U.S. Cl. ............................ 347/70; 347/68; 310/368

(58) Field of Classification Search .............. 347/68–72; 310/324, 328, 367, 368
See application file for complete search history.

(56) References Cited

U.S. PATENT DOCUMENTS 7,560,854 B2 * 7/2009 Ohashi et al. ................ 310/328
2007/0007860 A1 * 1/2007 Takabe et al. ................ 310/324

FOREIGN PATENT DOCUMENTS

JP 2000-032653 A 1/2000
JP 2004-066600 A 3/2004
JP 2007-118193 A 5/2007

* cited by examiner

*Primary Examiner* — Geoffrey Mruk
(74) *Attorney, Agent, or Firm* — Kilpatrick Townsend & Stockton LLP

(57) ABSTRACT

A liquid ejecting head includes a flow passage forming substrate that includes a plurality of pressure generating chambers juxtaposed to each other and each in communication with a nozzle for ejecting droplets, and piezoelectric elements disposed on the flow passage forming substrate with a diaphragm interposed therebetween. The piezoelectric elements include a lower electrode, a piezoelectric layer, and an upper electrode. The piezoelectric layer tapers downward at its ends. The lower electrode has a width smaller than the width of each of the pressure generating chambers. The piezoelectric layer has a larger width than the lower electrode. The diaphragm has a top layer formed of a titanium oxide ($TiO_x$) insulator film. The lower electrode has a top layer formed of a lanthanum nickel oxide ($LaNi_yO_x$) orientation control layer. The piezoelectric layer is formed of columnar crystals, and one part of the piezoelectric layer disposed on the insulator film has a smaller average grain size than the other part of the piezoelectric layer disposed on the orientation control layer.

14 Claims, 12 Drawing Sheets

LIQUID EJECTING HEAD, LIQUID EJECTING APPARATUS, AND ACTUATOR

This application claims priority to Japanese Patent Application No. 2008-082880 filed on Mar. 27, 2008, the entire disclosure of which is expressly incorporated by reference herein.

BACKGROUND

1. Technical Field

The present invention relates to a liquid ejecting head for ejecting droplets from a nozzle in response to the displacement of a piezoelectric element, a liquid ejecting apparatus, and an actuator that includes a piezoelectric element.

2. Related Art

A representative example of liquid ejecting heads for ejecting droplets is an ink jet recording head. A typical ink jet recording head includes a piezoelectric element disposed on a flow passage forming substrate with a diaphragm interposed therebetween. The flow passage forming substrate includes a pressure generating chamber. The piezoelectric element includes a lower electrode, a piezoelectric layer, and an upper electrode. A displacement of the piezoelectric element generates pressure in the pressure generating chamber, allowing the ink jet recording head to eject ink droplets from a nozzle. It is known that the displacement characteristics of a piezoelectric element used in such an ink jet recording head depend greatly on the crystalline orientation of a piezoelectric layer. Thus, in some proposed piezoelectric elements, the crystals of a piezoelectric layer are appropriately orientated to improve the displacement characteristics (see, for example, JP-A-2004-66600).

In some piezoelectric elements that include a lower electrode, a piezoelectric layer, and an upper electrode, the piezoelectric layer tapers downward at its ends (tapered surfaces) (see, for example, JP-A-2007-118193).

In a piezoelectric element described in JP-A-2007-118193, although no upper electrode is formed on inclined end faces (hereinafter referred to as a tapered portion) of a piezoelectric layer, a lower electrode is continuously disposed across a plurality of piezoelectric elements. Thus, the tapered portion of the piezoelectric layer undergoes a strong driving electric field and may be damaged.

In piezoelectric elements described in JP-A-2004-66600 and JP-A-2007-118193, a lower electrode is continuously disposed across a plurality of piezoelectric elements. In other piezoelectric elements, a lower electrode is patterned for each piezoelectric element, and a piezoelectric layer extends to the outside of the lower electrode (for example, JP-A-2000-32653).

In a piezoelectric element described in JP-A-2000-32653, a tapered portion of a piezoelectric layer does not undergo a strong driving electric field and may not be damaged by the driving electric field. However, when a piezoelectric layer described in JP-A-2004-66600 is applied to a piezoelectric element described in JP-A-2000-32653 to improve the displacement characteristics of the piezoelectric element, the piezoelectric layer may be damaged around an end of a lower electrode during the operation of the piezoelectric element probably because of a difference in crystallinity between one portion of the piezoelectric layer on the lower electrode and the other portion of the piezoelectric layer outside the lower electrode (on a diaphragm).

Such problems may occur not only in ink jet recording heads for ejecting ink droplets, but also in other liquid ejecting heads for ejecting droplets and actuators that include a piezoelectric element. Furthermore, the piezoelectric element may have a low response speed and may be difficult to drive at a high speed.

SUMMARY

An advantage of some aspects of the invention is that it provides a liquid ejecting head that includes a piezoelectric element having improved displacement characteristics, can be driven at a high speed, and includes a piezoelectric layer having improved durability to resist damage, a liquid ejecting apparatus, and an actuator.

According to one aspect of the invention, a liquid ejecting head includes a flow passage forming substrate that includes a plurality of pressure generating chambers juxtaposed to each other and each in communication with a nozzle for ejecting droplets, and piezoelectric elements disposed on the flow passage forming substrate with a diaphragm interposed therebetween, the piezoelectric elements including a lower electrode, a piezoelectric layer, and an upper electrode, wherein the piezoelectric layer tapers downward at its ends, the lower electrode has a width smaller than the width of each of the pressure generating chambers, the piezoelectric layer has a larger width than the lower electrode, the diaphragm has a top layer formed of a titanium oxide ($TiO_x$) insulator film, the lower electrode has a top layer formed of a lanthanum nickel oxide ($LaNi_yO_x$) orientation control layer, the piezoelectric layer is formed of columnar crystals, and one part of the piezoelectric layer disposed on the insulator film has a smaller average grain size than the other part of the piezoelectric layer disposed on the orientation control layer.

In such a liquid ejecting head, the entire piezoelectric layer has high, substantially uniform crystallinity. Thus, the piezoelectric element can be driven at a high speed, and the piezoelectric layer has high durability to resist damage.

Preferably, the piezoelectric layer has a rhombohedral, tetragonal, or monoclinic crystal structure. Preferably, the orientation control layer and at least part of the piezoelectric layer disposed on the orientation control layer are formed of perovskite crystals having a (110), (001), (111), or (113) preferred orientation. This ensures the high speed operation of the piezoelectric element and more securely protects the piezoelectric layer from damage associated with repeated operation of the piezoelectric element.

Preferably, the end faces of the lower electrode covered with the piezoelectric layer taper downward. This further increases the crystallinity of the piezoelectric layer at the end faces of the lower electrode. This ensures the high speed operation of the piezoelectric element and more securely protects the piezoelectric layer from damage associated with repeated operation of the piezoelectric element.

Preferably, the lower electrode further includes an electroconductive layer under the orientation control layer, the electroconductive layer being formed of a material having a resistivity lower than that of the orientation control layer. Through the electroconductive layer, a sufficient electric current can be supplied to a plurality of piezoelectric elements even when the piezoelectric elements are driven simultaneously. This allows for uniform displacement characteristics of the piezoelectric elements juxtaposed to each other.

Preferably, the electroconductive layer is covered with the orientation control layer. Thus, only the orientation control layer of the lower electrode is in contact with the piezoelectric layer. This can more reliably increase the crystallinity of the piezoelectric layer.

Preferably, the electroconductive layer is formed of a metallic material, an oxide of a metallic material, or an alloy thereof. Preferably, the metallic material contains at least one element selected from the group consisting of copper, aluminum, tungsten, platinum, iridium, ruthenium, silver, nickel, osmium, molybdenum, rhodium, titanium, magnesium, and cobalt. With these materials, a sufficient electric current can be supplied to the piezoelectric element with higher reliability.

Preferably, the piezoelectric layer is mainly composed of lead zirconium titanate (PZT). With such a piezoelectric layer, the piezoelectric element can have excellent displacement characteristics.

Preferably, the end faces of the piezoelectric layer are covered with a moisture-resistant protective film. Preferably, the end faces of the piezoelectric layer are covered with the upper electrode. These can prevent the piezoelectric layer from being damaged by atmospheric water.

While the electrodes in the piezoelectric element may have any structure, the lower electrodes may be individually disposed on each of the pressure generating chambers as individual electrodes of the piezoelectric element, and the upper electrode may be continuously disposed over the pressure generating chambers as a common electrode of the piezoelectric element. This can improve the displacement characteristics of the piezoelectric element independently of the electrode structure and prevent the piezoelectric layer from being damaged, thus improving the durability of the piezoelectric layer.

According to another aspect of the invention, a liquid ejecting apparatus includes a liquid ejecting head according to the invention. Such a liquid ejecting apparatus can include a highly durable and reliable liquid ejecting head.

According to still another aspect of the invention, an actuator includes a diaphragm disposed on a substrate, and a piezoelectric element disposed on the diaphragm, the piezoelectric element including a lower electrode, a piezoelectric layer, and an upper electrode, wherein the piezoelectric layer tapers downward at its ends, the piezoelectric layer has a larger width than the lower electrode to cover end faces of the lower electrode, the diaphragm has a top layer formed of a titanium oxide ($TiO_x$) insulator film, the lower electrode has a top layer formed of a lanthanum nickel oxide ($LaNi_yO_x$) orientation control layer, the piezoelectric layer is formed of columnar crystals, and one part of the piezoelectric layer disposed on the insulator film has a smaller average grain size than the other part of the piezoelectric layer disposed on the orientation control layer.

In such an actuator, the entire piezoelectric layer has high, substantially uniform crystallinity. In other words, the actuator can be driven at a high speed and has high durability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described in detail below.

First Embodiment

Figure 1:
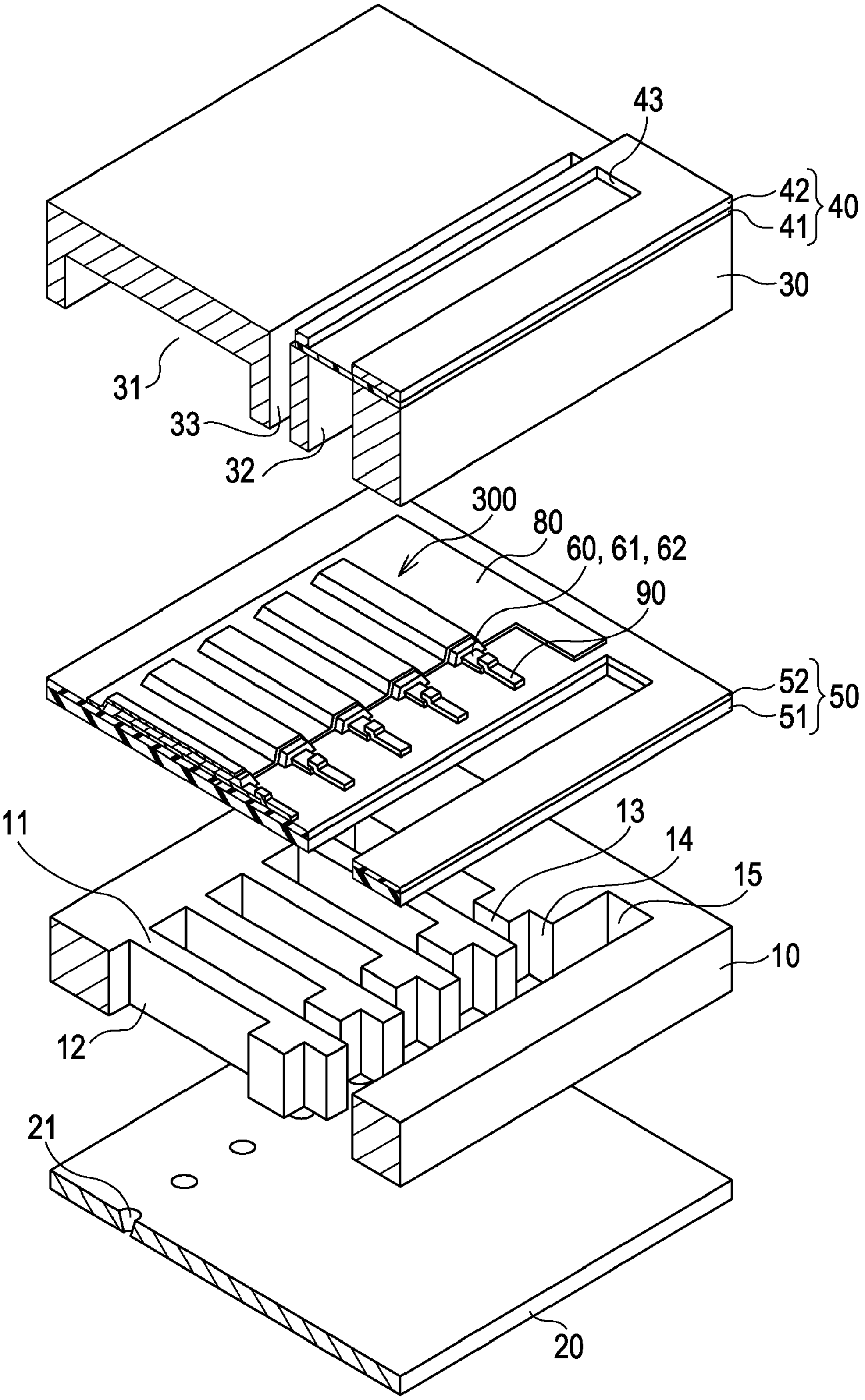
FIG. 1 is an exploded perspective view of a recording head according to a first embodiment of the invention.
Figure 2A:
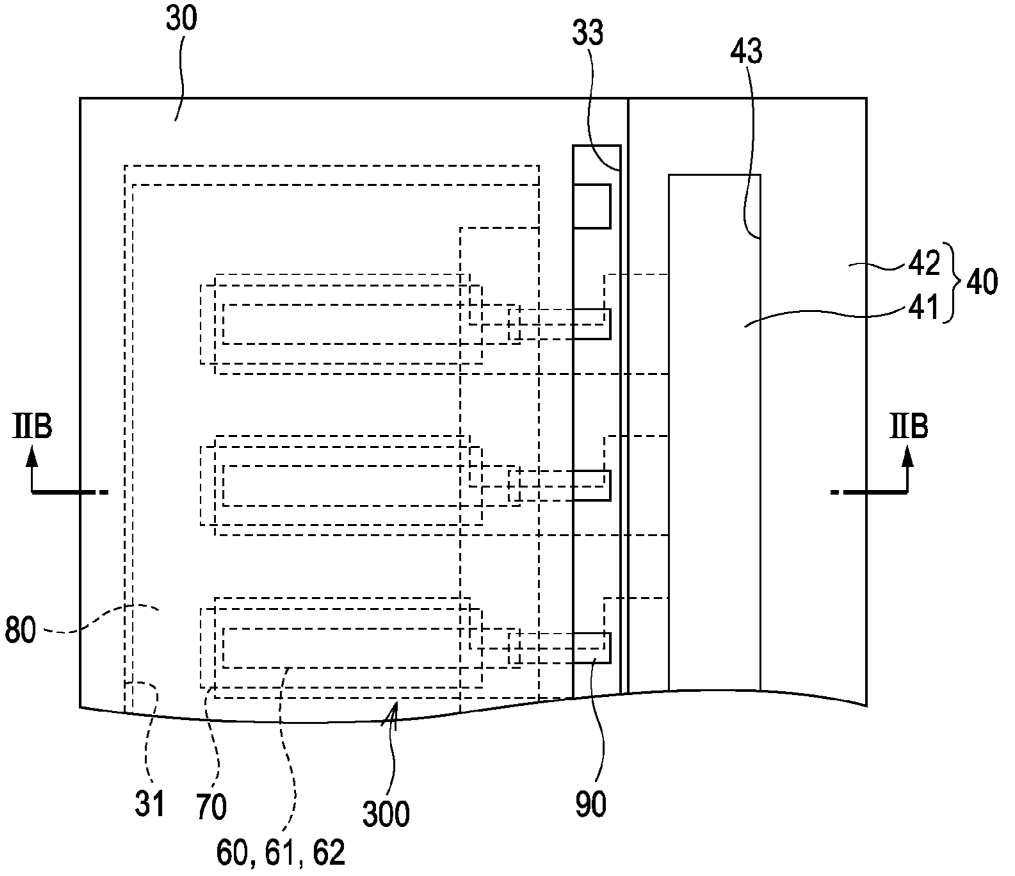
FIG. 2A is a plan view of the recording head according to the first embodiment.
Figure 2B:
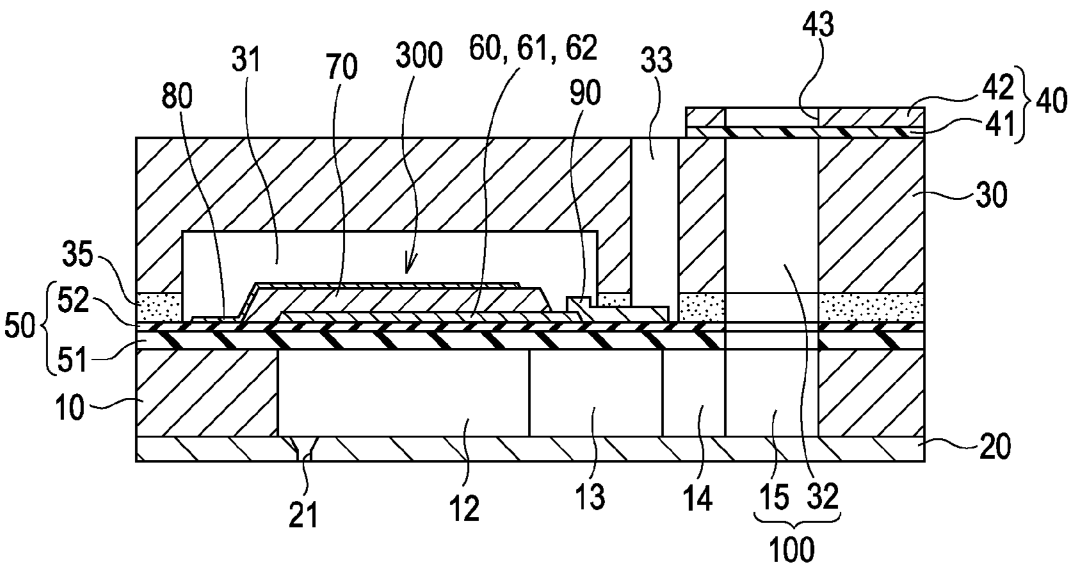
FIG. 2B is a cross-sectional view of the recording head according to the first embodiment.

FIG. 1 is an exploded perspective view of an ink jet recording head, which is an example of a liquid ejecting head, according to a first embodiment of the invention. FIG. 2A is a plan view of the ink jet recording head according to the first embodiment. FIG. 2B is a cross-sectional view of the ink jet recording head taken along the line IIB-IIB of FIG. 2A.

A flow passage forming substrate 10 is a single-crystal silicon substrate having a (110) crystal plane orientation. An elastic oxide film 51 is disposed on the flow passage forming substrate 10. The flow passage forming substrate 10 includes a plurality of pressure generating chambers 12 juxtaposed to each other in the width direction. The pressure generating chambers 12 are divided by partitions 11 and are covered with the elastic film 51.

The flow passage forming substrate 10 further includes ink feed channels 13 defined by the partitions 11 and in communication with respective ends of the pressure generating chambers 12 in the longitudinal direction. The flow passage forming substrate 10 further includes communication paths 14 and a communication portion 15 in communication with the communication paths 14. The communication portion 15, together with a reservoir portion 32 in a protective substrate 30 described below, constitutes a reservoir 100, which is a common ink chamber (liquid chamber) of the pressure generating chambers 12.

The ink feed channels 13 have a cross-sectional area smaller than that of the pressure generating chambers 12 to maintain a constant flow resistance against ink flowing from the communication portion 15 to the pressure generating chambers 12. For example, flow passages between the reservoir 100 and the pressure generating chambers 12 are narrowed in the proximity of the pressure generating chambers 12 to form the ink feed channels 13 having a width smaller than the pressure generating chambers 12. While each of the flow passages is narrowed at one side thereof in the present embodiment, each of the flow passages may be narrowed at both sides thereof to form the ink feed channels 13. Alternatively, instead of reducing the width of the flow passages, the thickness of the flow passages may be reduced to form the ink feed channels 13. The partitions 11 on opposite sides of each of the pressure generating chambers 12 are extended to the communication portion 15 to define spaces between the ink feed channels 13 and the communication portion 15, thus forming the communication paths 14.

While the flow passage forming substrate 10 is a single-crystal silicon substrate in the present embodiment, the flow passage forming substrate 10 may be formed of glass ceramic or stainless steel.

The bottom surface of the flow passage forming substrate 10 is attached to a nozzle plate 20 with an adhesive or a heat-seal film. The nozzle plate 20 has nozzles 21 near the ends of the pressure generating chambers 12 opposite the ink feed channels 13. The nozzle plate 20 may be formed of glass ceramic, single-crystal silicon, or stainless steel.

The top surface of the flow passage forming substrate 10 is attached to a diaphragm 50, on which piezoelectric elements 300 are disposed. The piezoelectric elements 300 and the diaphragm 50 constitute an actuator. The operation of the piezoelectric elements 300 causes displacements of the diaphragm 50. The diaphragm 50 includes the elastic film 51 on the flow passage forming substrate 10 and an insulator film 52 on the elastic film 51. The insulator film 52 is formed of titanium oxide ($TiO_x$).

The piezoelectric elements 300 disposed on the diaphragm 50 (insulator film 52) include a lower electrode film 60, a piezoelectric layer 70, and an upper electrode film 80. The piezoelectric elements 300 may be portions that include at least the piezoelectric layer 70, as well as the portions composed of the lower electrode film 60, the piezoelectric layer 70, and the upper electrode film 80. In general, one of the lower electrode film 60 and the upper electrode film 80 is a common electrode, and the other is an individual electrode. The individual electrode, together with the piezoelectric layer 70, is patterned for each of the pressure generating chambers 12.

Figure 3:
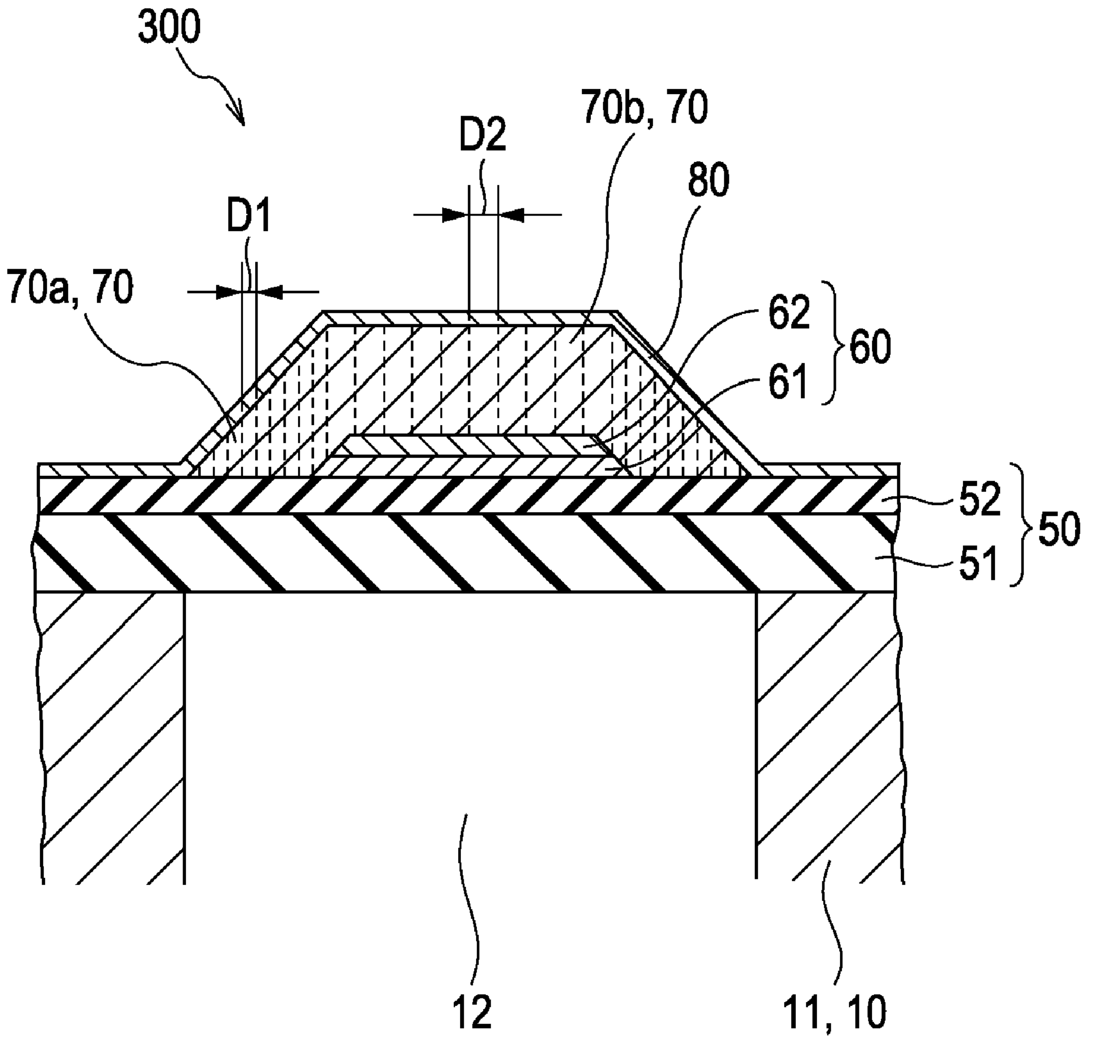
FIG. 3 is a cross-sectional view of a principal portion of the recording head according to the first embodiment.

The structure of a piezoelectric element 300 according to the present embodiment will be described in detail below. As illustrated in FIG. 3, a lower electrode film 60 is formed as an individual electrode in a region opposite a pressure generating chamber 12. The lower electrode film 60 has a smaller width than the pressure generating chamber 12. The lower electrode film 60 tapers downward at its ends. The lower electrode film 60 extends from a portion corresponding to one end of the pressure generating chamber 12 in the longitudinal direction onto a protrusion of a partition 11 defining an ink feed channel 13 (hereinafter referred to as "surrounding wall") and is connected to a lead electrode 90, for example, formed of gold (Au) outside the pressure generating chamber 12. A voltage is selectively applied to each piezoelectric element 300 through the lead electrode 90 (see FIG. 2).

The lower electrode film 60 is composed of an electroconductive layer 61 disposed on the insulator film 52 and an orientation control layer 62 disposed on the electroconductive layer 61. The orientation control layer 62 is formed of lanthanum nickel oxide ($LaNi_yO_x$). The electroconductive layer 61 is formed of a material having a lower resistivity than the orientation control layer 62, for example, a metallic material, an oxide of a metallic material, or an alloy thereof. Preferred examples of the metallic material of the electroconductive layer 61 include metallic materials that contain at least one element selected from the group consisting of copper, aluminum, tungsten, platinum, iridium, ruthenium, silver, nickel, osmium, molybdenum, rhodium, titanium, magnesium, and cobalt.

Lanthanum nickel oxide ($LaNi_yO_x$) used in the orientation control layer 62 according to the present embodiment is $LaNiO_3$ (x=3 and y=1). The orientation control layer 62 formed of such a lanthanum nickel oxide is substantially unaffected by the plane orientation of the underlying electroconductive layer 61 and is formed of perovskite crystals.

The orientation control layer 62 having such crystallinity may be formed by any method, including sputtering, a sol-gel method, and metal organic deposition (MOD), under appropriate conditions.

The piezoelectric layer 70 has a larger width than the lower electrode film 60 and a smaller width than the pressure generating chamber 12. Thus, the piezoelectric layer 70 is continuously formed on the lower electrode film 60 and the insulator film 52 outside the lower electrode film 60. The lower electrode film 60 in a region opposite the pressure generating chamber 12 is covered with the piezoelectric layer 70. The both ends of the piezoelectric layer 70 in the longitudinal direction extend beyond the pressure generating chamber 12. An end of the piezoelectric layer 70 in the longitudinal direction is disposed in the vicinity of one end of the pressure generating chamber 12. The lower electrode film 60 extends beyond the end of the piezoelectric layer 70.

A piezoelectric layer **70*a* disposed on the insulator film 52 is formed of crystals having a smaller grain size than a piezoelectric layer 70*b* disposed on the orientation control layer 62. In other words, the crystal grain size D1 of the piezoelectric layer 70*a* disposed on the insulator film 52 is smaller than the crystal grain size D2 of the piezoelectric layer 70*b* disposed on the orientation control layer 62. The crystal grain sizes D1 and D2 are the average grain sizes of the piezoelectric layers 70*a* and 70*b***, respectively, as viewed from the top.

When the crystal grain size D1 is smaller than the crystal grain size D2, the entire piezoelectric layer 70 has high, substantially uniform crystallinity. Thus, the piezoelectric element 300 has improved displacement characteristics, and the piezoelectric layer 70 can be protected from damage associated with the displacement of the piezoelectric element 300. As described above, the piezoelectric layer **70*b* disposed on the orientation control layer 62 is formed of crystals grown epitaxially on the orientation control layer 62. The piezoelectric layer 70*b* therefore has high crystallinity even when the crystal grain size of the piezoelectric layer 70*b* is relatively large. On the other hand, the piezoelectric layer 70*a* disposed on the insulator film 52 is formed of crystals having a smaller grain size than the piezoelectric layer 70*b* disposed on the orientation control layer 62, although the crystals are not epitaxially grown. The piezoelectric layer 70*a* therefore has substantially the same crystallinity as the piezoelectric layer 70*b***.

In the piezoelectric layer 70, at least the piezoelectric layer **70*b* disposed on the orientation control layer 62 is preferably formed of perovskite crystals, as in the orientation control layer 62. Preferably, the orientation control layer 62 and the piezoelectric layer 70*b* disposed on the orientation control layer 62 have a (110), (001), (111), or (113) preferred orientation. More specifically, preferably, the orientation control layer 62 has a (110), (001), (111), or (113) preferred orientation, and the piezoelectric layer 70*b* disposed on the orientation control layer 62 is formed of crystals epitaxially grown on the orientation control layer 62. Preferably, the piezoelectric layer 70*a* disposed on the insulator film 52** is also formed of perovskite crystals having a (110), (001), (111), or (113) preferred orientation.

The piezoelectric element 300 having such a piezoelectric layer 70 has satisfactory displacement characteristics and improved durability. In other words, since the piezoelectric layer 70 has high crystallinity, the piezoelectric element 300 has satisfactory displacement characteristics, and the reduction in displacement of the piezoelectric element 300 during its repeated operation can be minimized. In general, the displacement of a piezoelectric element is reduced during its repeated operation because of degradation of the piezoelectric element. However, the piezoelectric layer 70 having high crystallinity can minimize the reduction in displacement. The piezoelectric layer 70 having high crystallinity also improves the responsivity of the piezoelectric element 300, allowing the piezoelectric element 300 to be driven at a high speed.

The piezoelectric layer 70, particularly the piezoelectric layer 70*b* disposed on the orientation control layer 62, preferably has a rhombohedral, tetragonal, or monoclinic crystal structure and is more preferably formed of columnar crystals. These can more reliably minimize the reduction in displacement of the piezoelectric element 300. The top layer of the lower electrode film 60 is an orientation control layer 62 formed of lanthanum nickel oxide, and the top layer of the diaphragm 50 is the insulator film 52 formed of titanium oxide. Thus, the piezoelectric layer 70 having any of the crystal structures described above and formed of columnar crystals can be formed relatively easily.

Preferably, the piezoelectric layer 70 is formed of a material that is mainly composed of lead zirconium titanate [$Pb(Zr,Ti)O_3$: PZT]. The piezoelectric layer 70 may be formed of a solid solution of lead magnesium niobate and lead titanate [$Pb(Mg_{1/3}Nb_{2/3})O_3$—$PbTiO_3$: PMN-PT] or a solid solution of lead zinc niobate and lead titanate [$Pb(Zn_{1/3}Nb_{2/3})O_3$—$PbTiO_3$: PZN-PT].

The piezoelectric layer 70 may be produced by any method, including a sol-gel method and MOD. The production conditions of the piezoelectric layer 70, such as deposition conditions and heating (firing) conditions, may be appropriately controlled to form the piezoelectric layer 70 having the crystallinity as described above.

As described above, the end faces of the lower electrode film 60 are not perpendicular but are inclined relative to the surface of the diaphragm 50. Preferably, the end faces of the lower electrode film 60 form an angle in the range of 10° to 30° with the surface of the diaphragm 50. Within this angle range, the piezoelectric layer 70 can be satisfactorily formed on the end faces of the lower electrode film 60. This ensures more uniform crystallinity across the piezoelectric layer 70. Thus, the reduction in displacement of the piezoelectric element 300 and the diaphragm 50 can be more properly minimized.

Since the lower electrode film 60 includes the electroconductive layer 61 having a lower resistivity than the orientation control layer 62, as described above, a sufficient electric current can be supplied to a plurality of piezoelectric elements 300 even when the piezoelectric elements 300 are driven simultaneously. Thus, even when a plurality of piezoelectric elements 300 juxtaposed to each other are driven simultaneously, each of the piezoelectric elements 300 consistently has substantially the same displacement characteristics.

The upper electrode film 80 is continuously formed in a region opposite the pressure generating chambers 12 and extends from the other end of the pressure generating chambers 12 in the longitudinal direction onto the surrounding wall. Thus, the upper electrode film 80 almost entirely covers the top and end faces of the piezoelectric layers 70 in the region opposite the pressure generating chambers 12. The upper electrode film 80 therefore substantially prevents atmospheric water (moisture) from entering the piezoelectric layers 70. This protects the piezoelectric elements 300 (piezoelectric layers 70) from damage caused by water (moisture), thus significantly improving the durability of the piezoelectric elements 300.

The protective substrate 30 is attached with an adhesive 35 to the flow passage forming substrate 10, on which the actuator composed of the diaphragm 50 and the piezoelectric elements 300 is formed. The protective substrate 30 includes a piezoelectric element holding portion 31 in a region opposite the piezoelectric elements 300. The piezoelectric element holding portion 31 has a space so as not to prevent the displacement of the piezoelectric elements 300. The piezoelectric element holding portion 31 houses the piezoelectric elements 300 to protect the piezoelectric elements 300 from the effects of the external environment. The protective substrate 30 includes the reservoir portion 32 in correspondence with the communication portion 15 in the flow passage forming substrate 10. The reservoir portion 32 is opened at the top of the protective substrate 30 and extends in the width direction. As described above, the reservoir portion 32 and the communication portion 15 in the flow passage forming substrate 10 constitute the reservoir 100, which serves as a common ink chamber for the pressure generating chambers 12.

A through-hole 33 in the protective substrate 30 is disposed between the piezoelectric element holding portion 31 and the reservoir portion 32. An end of the lower electrode film 60 and an end of the lead electrode 90 are exposed in the through-hole 33. The lower electrode film 60 and the lead electrode 90 are connected to a driving IC (not shown) for driving the piezoelectric elements 300 via interconnecting wiring in the through-hole 33.

The protective substrate 30 may be formed of glass, a ceramic material, metal, or resin. Preferably, the material of the protective substrate 30 has substantially the same thermal expansion coefficient as the flow passage forming substrate 10. In the present embodiment, the protective substrate 30 is formed of the same material as the flow passage forming substrate 10, that is, silicon single crystals.

The protective substrate 30 is attached to a compliance substrate 40, which includes a sealing film 41 and a fixing plate 42. The sealing film 41 is formed of a flexible material and seals one side of the reservoir portion 32. The fixing plate 42 is formed of a hard material, such as metal. The fixing plate 42 has an opening 43 on top of the reservoir 100. Thus, one side of the reservoir 100 is sealed with the flexible sealing film 41 alone.

In the ink jet recording head according to the present embodiment, the reservoir 100 to the nozzles 21 are filled with ink supplied from an external ink supply unit (not shown). A voltage is applied to piezoelectric elements 300 in response to a recording signal from the driving IC (not shown) to deform the piezoelectric elements 300. The deformation increases the pressure in the corresponding pressure generating chambers 12, allowing the ink jet recording head to eject ink droplets from the corresponding nozzles 21.

A method for manufacturing an ink jet recording head will be described below with reference to FIGS. 4 to 7. FIGS. 4 to 7 are cross-sectional views illustrating processes for manufacturing an ink jet recording head.

Figure 4A:
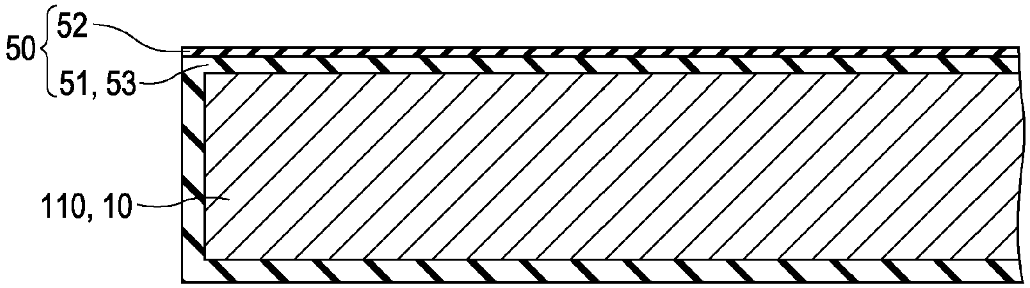
FIGS. 4A to 4C are cross-sectional views illustrating a process of manufacturing the recording head according to the first embodiment.

As illustrated in FIG. 4A, a diaphragm 50 is formed on a wafer 110 for a flow passage forming substrate. The wafer 110 is formed of silicon single crystals having a (110) crystal plane orientation. More specifically, first, an elastic film 51 of a silicon dioxide film 53 is formed. For example, the surface of the wafer 110 is thermally oxidized to form the elastic film 51 (silicon dioxide film 53). The elastic film 51 may be formed by another method. An insulator film 52 formed of titanium oxide ($TiO_x$) is formed on the elastic film 51 (silicon dioxide film 53) by any method, for example, sputtering.

The insulator film 52 of the diaphragm 50 also serves to prevent a lead component in a piezoelectric layer 70 of a piezoelectric element 300 from diffusing into the elastic film 51 and the flow passage forming substrate 10.

Figure 4B:
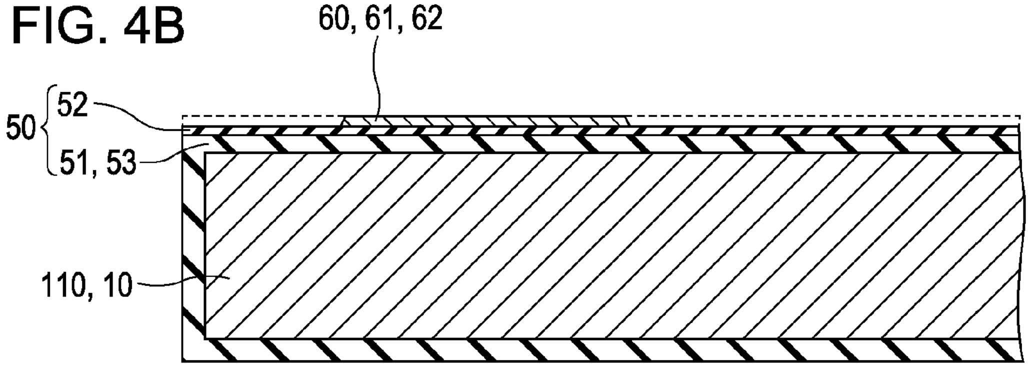

As illustrated in FIG. 4B, a lower electrode film 60 is formed on the diaphragm 50 (insulator film 52) and is patterned into a predetermined shape. More specifically, for example, a metallic material, such as platinum (Pt), is deposited on the insulator film 52 by sputtering to form the electroconductive layer 61. The orientation control layer 62 formed of lanthanum nickel oxide is formed on the electroconductive layer 61. The orientation control layer 62 and the electroconductive layer 61 are then successively patterned.

As described above, the orientation control layer 62 may be formed by sputtering, a sol-gel method, or MOD. The deposition conditions can be appropriately controlled to form the orientation control layer 62 having high crystallinity, as described above.

Figure 4C:
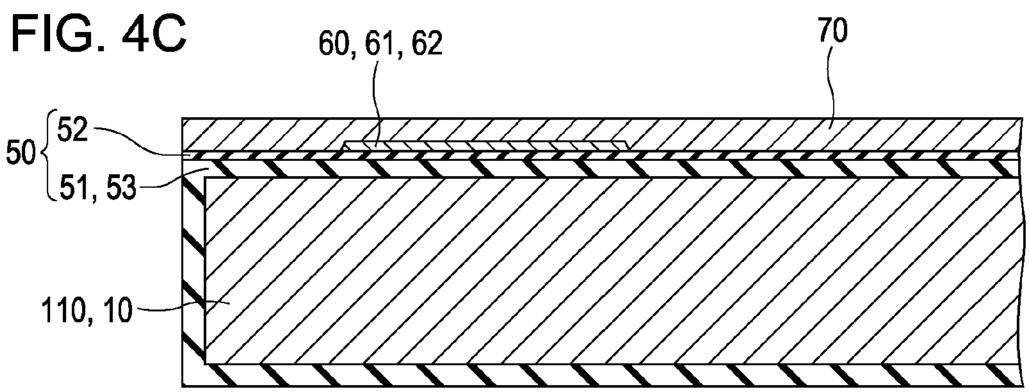

As illustrated in FIG. 4C, a piezoelectric layer 70, for example, formed of lead zirconium titanate (PZT) is formed over the entire surface of the wafer 110 for a flow passage forming substrate on which the lower electrode film 60 has been formed. The piezoelectric layer 70 may be formed by any method. In the present embodiment, the piezoelectric layer 70 is formed by a sol-gel method in the following manner. First, an organometallic compound is dissolved or dispersed in a solvent to prepare a so-called sol. The sol is applied over the wafer 110, is dried for gelation, and is fired at a high temperature to form the piezoelectric layer 70 formed of metal oxide. Alternatively, the piezoelectric layer 70 may be formed by MOD or sputtering.

The production conditions of the piezoelectric layer 70, such as deposition conditions and heating (firing) conditions, may be appropriately controlled to form the piezoelectric layer 70 having high crystallinity, as described above.

Figure 5A:
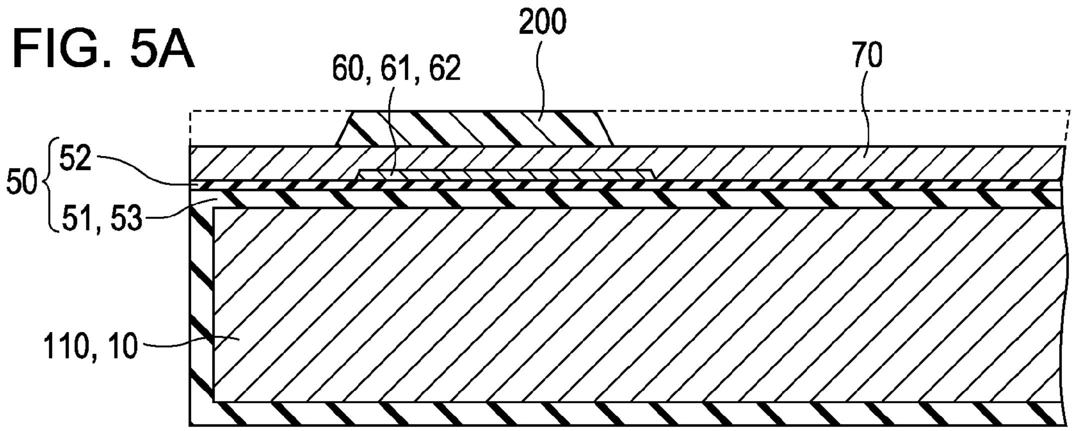
FIGS. 5A to 5C are cross-sectional views illustrating a process of manufacturing the recording head according to the first embodiment.

The piezoelectric layer 70 is then patterned into a predetermined shape. More specifically, as illustrated in FIG. 5A, a resist is applied to the piezoelectric layer 70, is exposed, and is developed to form a resist film 200 having a predetermined pattern. For example, a negative resist is applied to the piezoelectric layer 70 by spin coating, is exposed through a mask, is developed, and is baked to form the resist film 200. The negative resist may be replaced by a positive resist. The resist film 200 has end faces inclined with a predetermined angle.

Figure 5B:
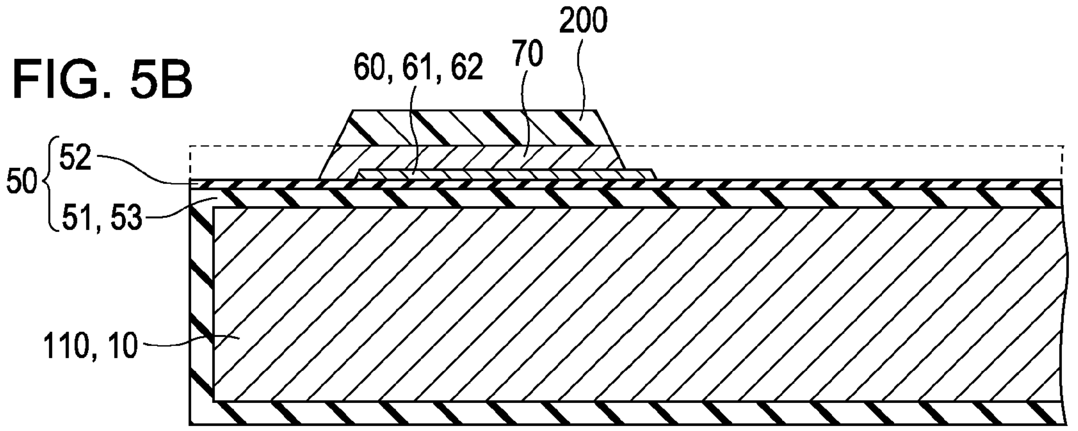

As illustrated in FIG. 5B, the piezoelectric layer 70 is patterned into a predetermined shape by ion milling using the resist film 200 as a mask. The piezoelectric layer 70 is patterned along the inclined end faces of the resist film 200. Thus, the piezoelectric layer 70 also has inclined end faces.

Figure 5C:
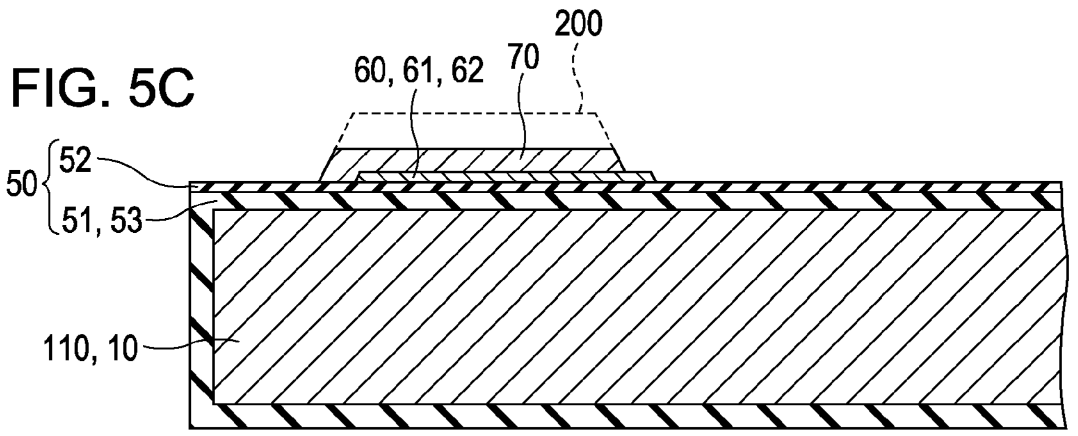

As illustrated in FIG. 5C, the resist film 200 is removed from the piezoelectric layer 70 by any method, for example, using an organic stripping solution. The piezoelectric layer 70 is washed, for example, with a cleaning liquid to completely remove the resist film 200.

Figure 6A:
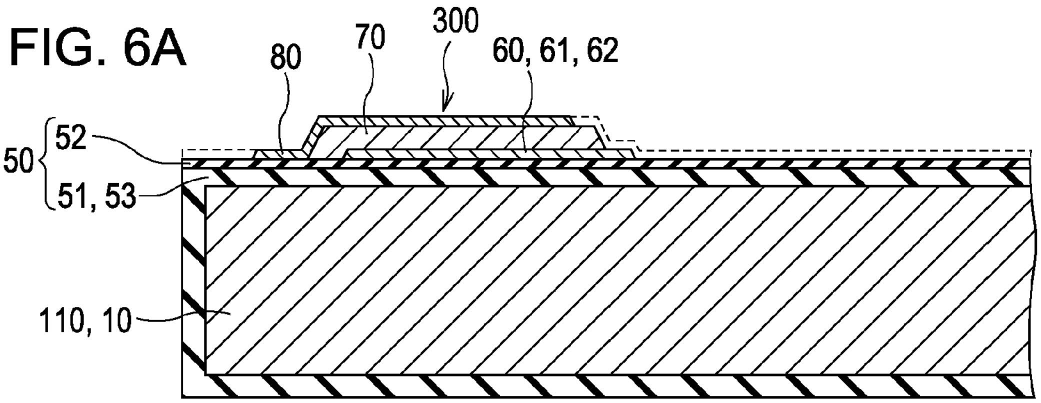
FIGS. 6A to 6C are cross-sectional views illustrating a process of manufacturing the recording head according to the first embodiment.

As illustrated in FIG. 6A, an upper electrode film 80 is formed over the entire surface of the wafer 110 for a flow passage forming substrate and is patterned into a predetermined shape to produce a piezoelectric element 300. The upper electrode film 80 may be formed of any material having relatively high electrical conductivity, preferably, a metallic material, such as iridium, platinum, or palladium. The upper electrode film 80 has such a thickness that the upper electrode film 80 does not interfere with the displacement of the piezoelectric element 300. However, it is desirable that the upper electrode film 80 has a relatively large thickness because the upper electrode film 80 also functions as a moisture-resistant protective film that protects the piezoelectric layer 70 from damage caused by water.

Figure 6B:
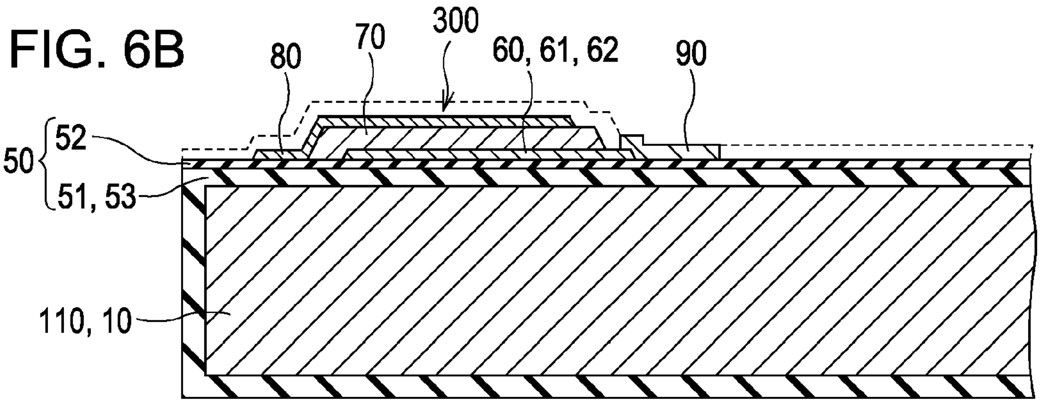
Figure 6C:
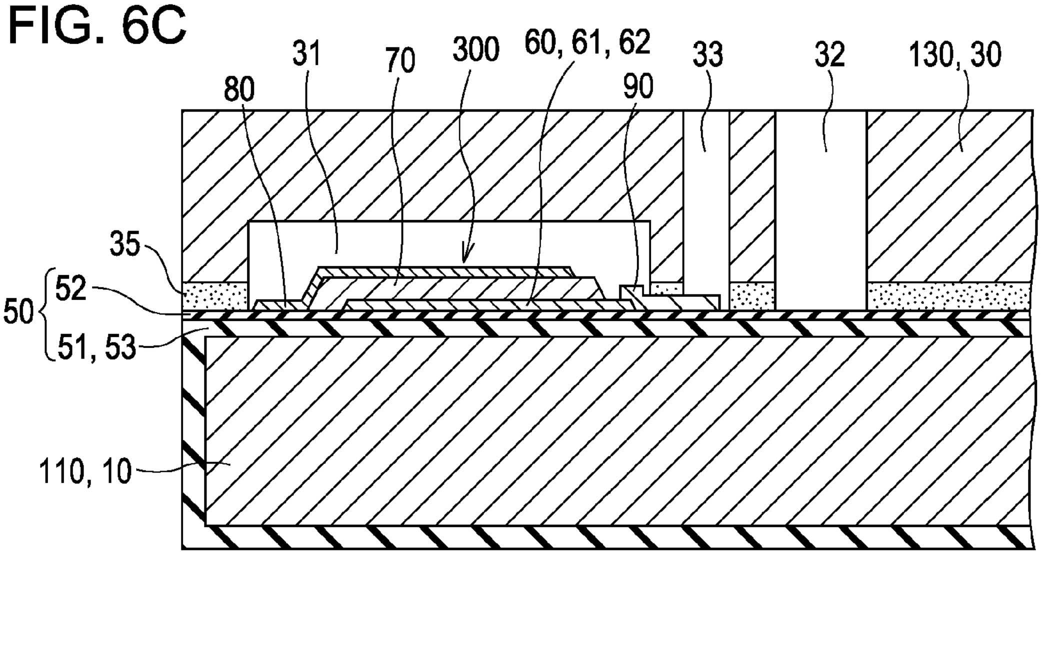

As illustrated in FIG. 6B, a gold (Au) lead electrode 90 is formed over the entire surface of the wafer 110 for a flow passage forming substrate and is patterned for each of the piezoelectric elements 300. As illustrated in FIG. 6C, a wafer 130 for a protective substrate, in which a plurality of protective substrates 30 are integrated, is attached to the wafer 110 for a flow passage forming substrate with an adhesive 35. The wafer 130 for a protective substrate includes a preformed piezoelectric element holding portion 31, a preformed reservoir portion 32, and a preformed through-hole 33.

Figure 7A:
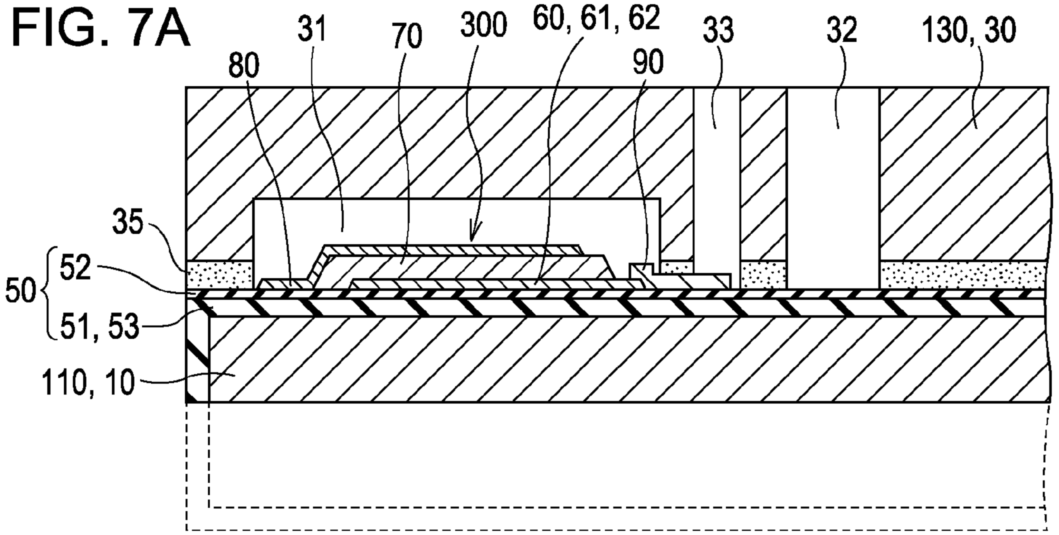
FIGS. 7A to 7C are cross-sectional views illustrating a process of manufacturing the recording head according to the first embodiment.
Figure 7B:
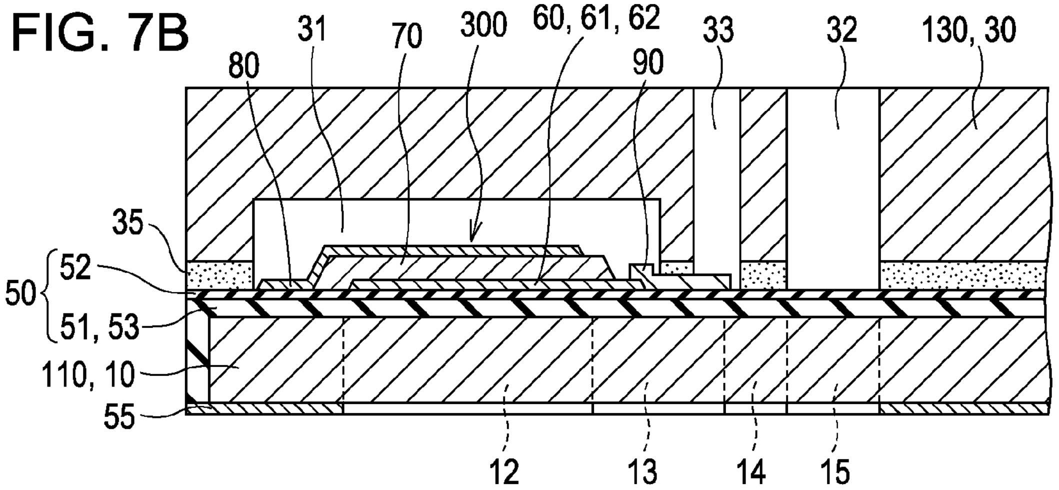
Figure 7C:
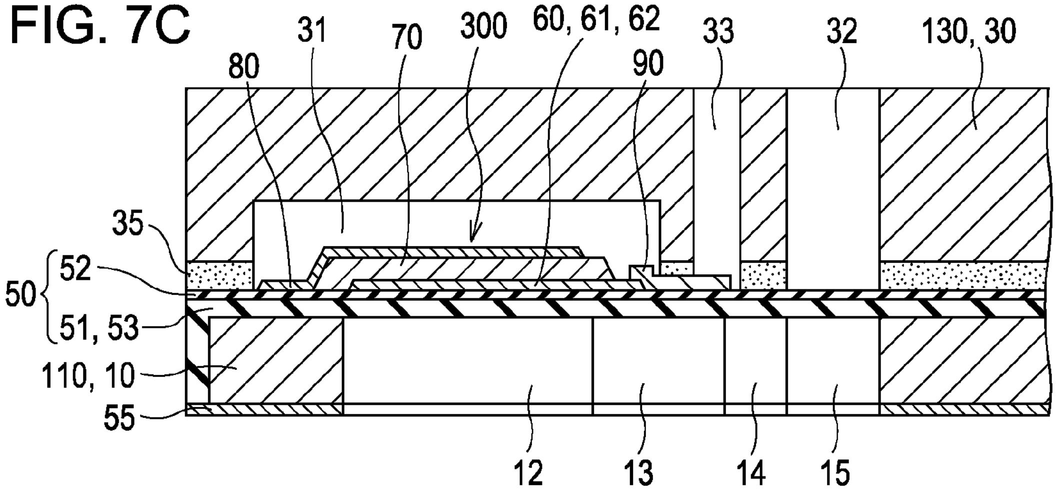

As illustrated in FIG. 7A, the thickness of the wafer 110 for a flow passage forming substrate is reduced. As illustrated in FIG. 7B, a protective film 55, for example, formed of silicon nitride ($SiN_x$) is formed on the wafer 110 for a flow passage forming substrate and is patterned into a predetermined shape using a mask. As illustrated in FIG. 7C, the wafer 110 for a flow passage forming substrate is anisotropically etched (wet-etched), for example, with an alkaline solution, such as KOH, using the protective film 55 as a mask to form pressure generating chambers 12, ink feed channels 13, communication paths 14, and a communication portion 15.

Although not shown in the drawings, unnecessary portions on the periphery of the wafer 110 for a flow passage forming substrate and the wafer 130 for a protective substrate are removed, for example, by dicing. A nozzle plate 20 is then attached to the wafer 110 for a flow passage forming substrate. A compliance substrate 40 is then attached to the wafer 130 for a protective substrate. The wafer 110 for a flow passage forming substrate is finally divided into chips as illustrated in FIG. 1 to manufacture ink jet recording heads.

Second Embodiment

Figure 8:
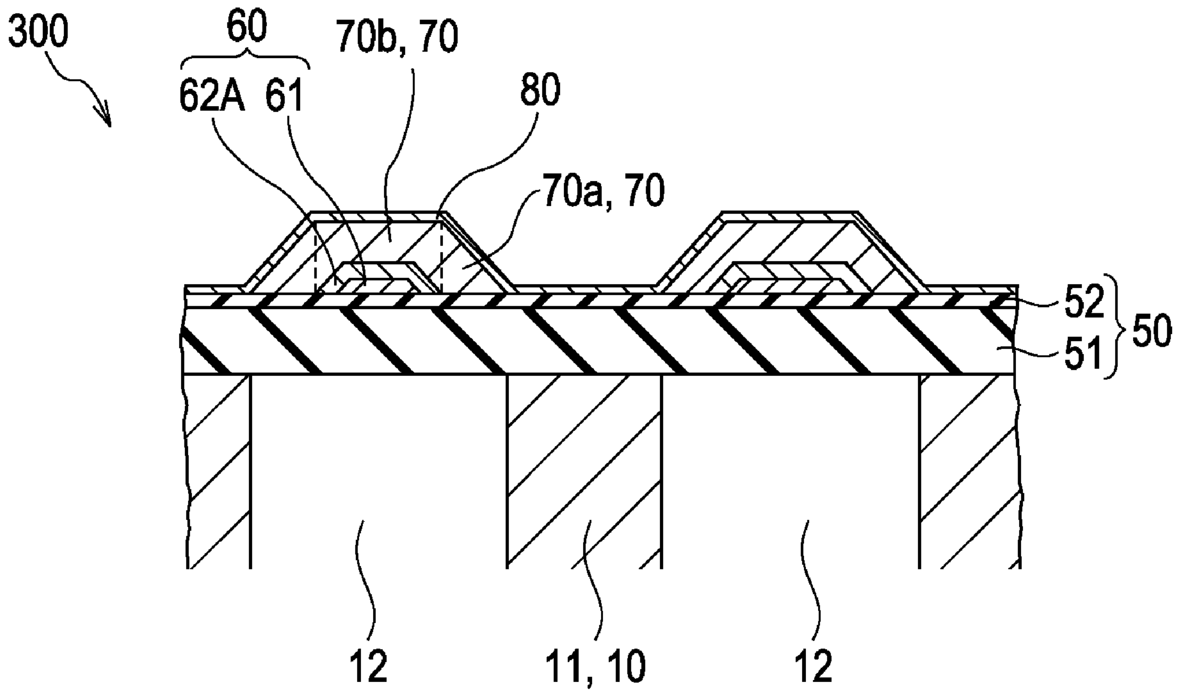
FIG. 8 is a cross-sectional view of a principal portion of a recording head according to a second embodiment of the invention.

FIG. 8 is a cross-sectional view of a principal portion of an ink jet recording head according to a second embodiment.

An ink jet recording head according to the present embodiment has the same structure as in the first embodiment except for the lower electrode film 60. In the first embodiment, the orientation control layer 62 is formed on the electroconductive layer 61 (top surface). In the present embodiment, as illustrated in FIG. 8, an orientation control layer 62A is formed on the top and end faces of an electroconductive layer 61; that is, the orientation control layer 62A covers the electroconductive layer 61.

Thus, a piezoelectric layer 70 is formed on the orientation control layer 62A even at the end faces of the lower electrode film 60. This further increases the crystallinity of the piezoelectric layer 70 at the ends of the lower electrode film 60.

Third Embodiment

Figure 9:
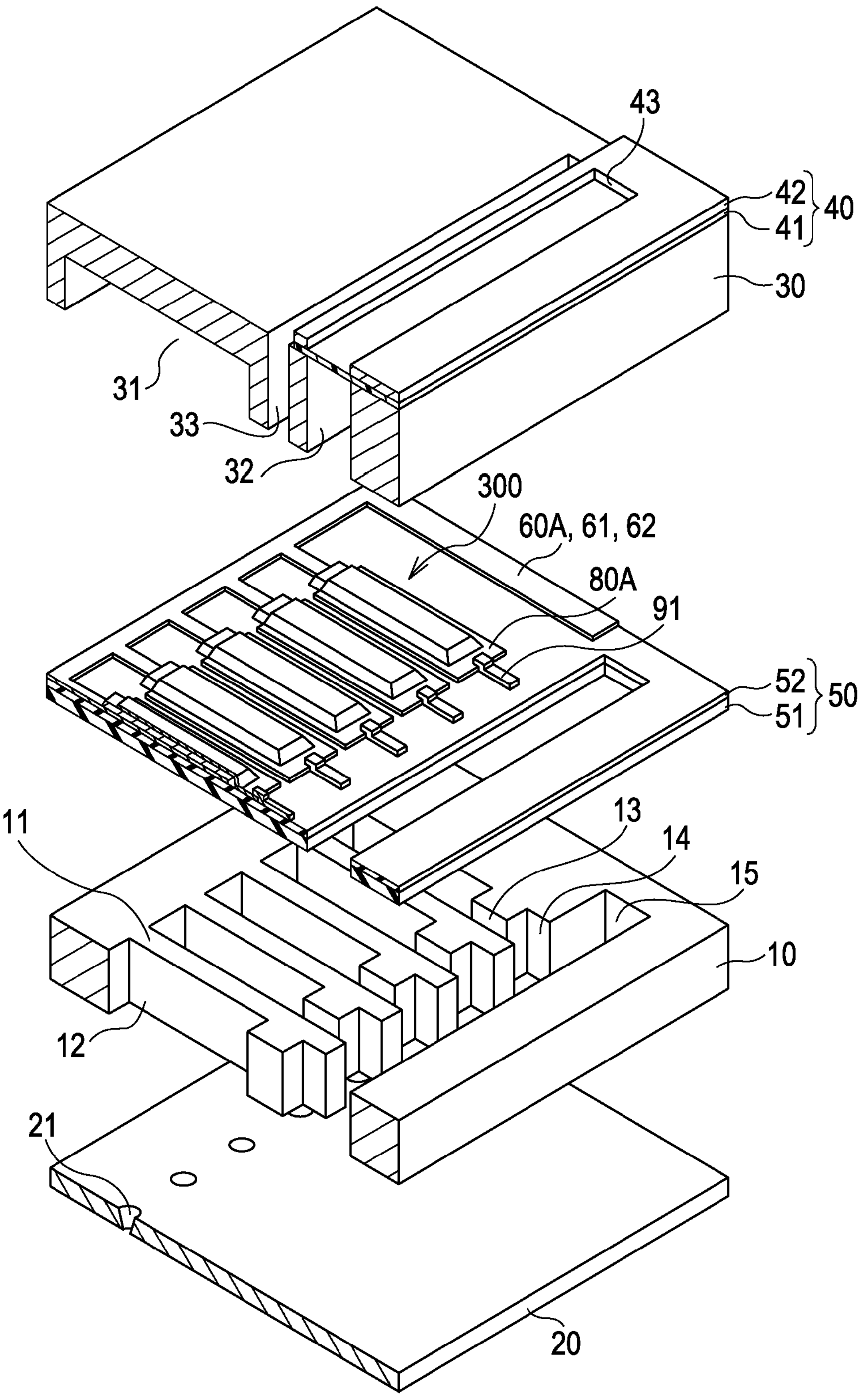
FIG. 9 is an exploded perspective view of a recording head according to a third embodiment of the invention.
Figure 10A:
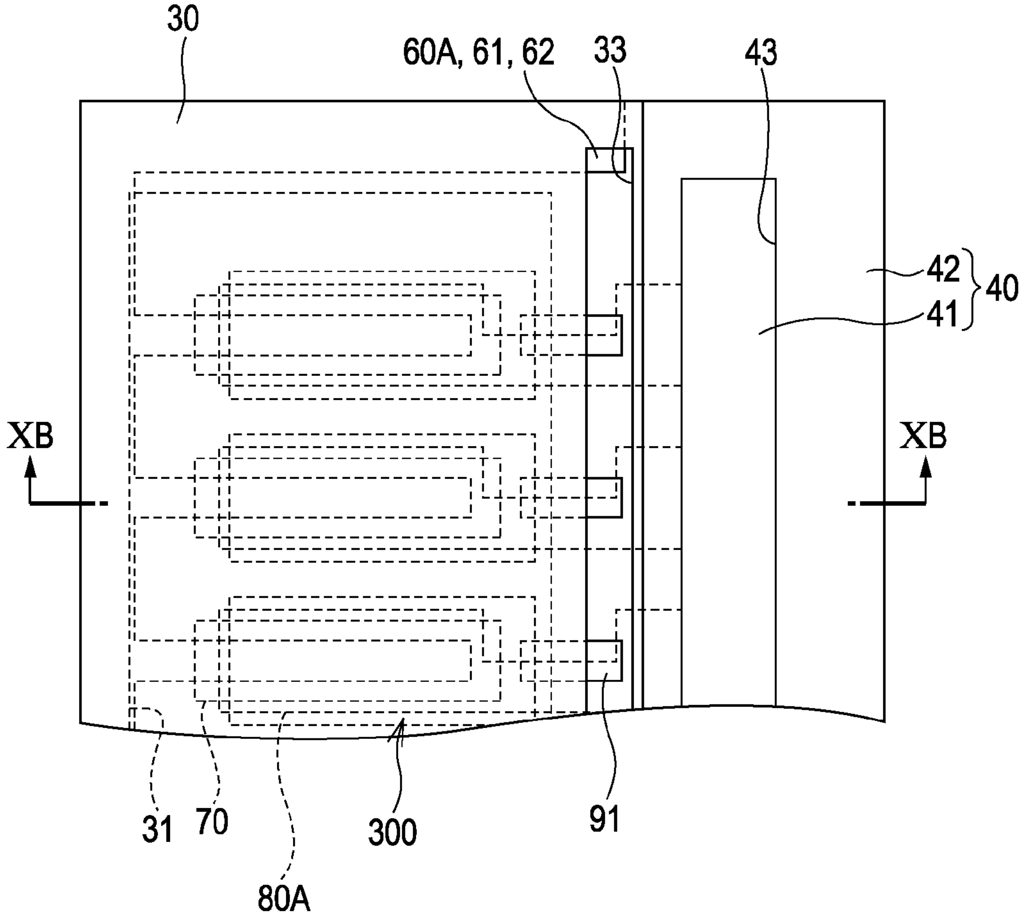
FIG. 10A is a plan view of the recording head according to the third embodiment.
Figure 10B:
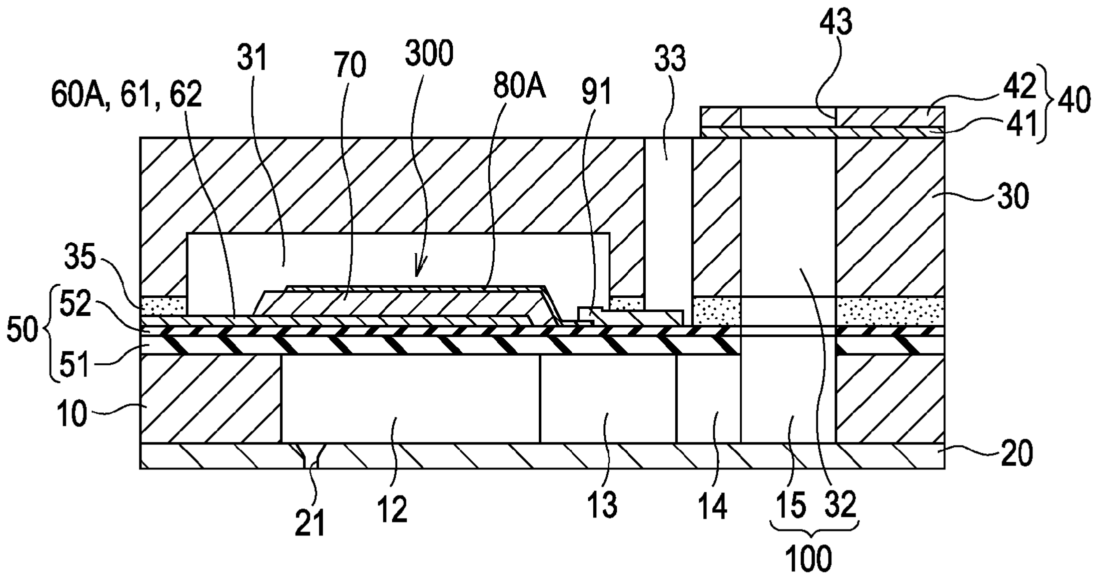
FIG. 10B is a cross-sectional view of the recording head according to the third embodiment.
Figure 11:
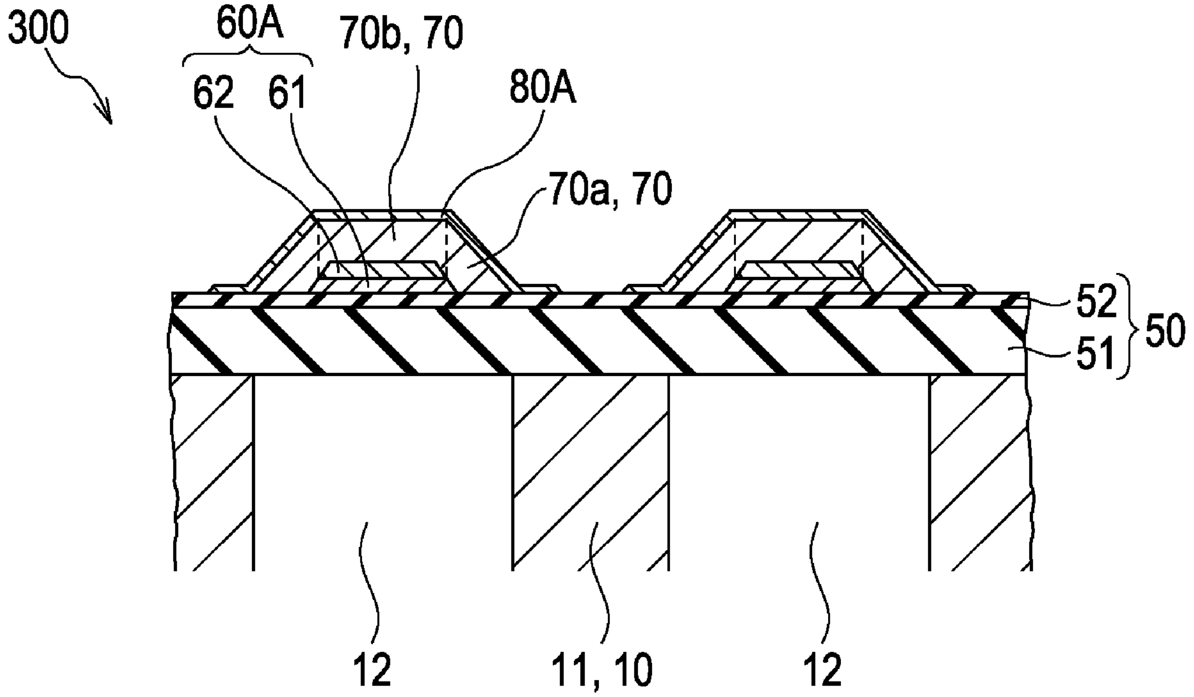
FIG. 11 is a cross-sectional view of a principal portion of the recording head according to the third embodiment.

FIG. 9 is an exploded perspective view of an ink jet recording head according to a third embodiment of the invention. FIG. 10A is a plan view of the ink jet recording head. FIG. 10B is a cross-sectional view of the ink jet recording head taken along the line XB-XB of FIG. 10A. FIG. 11 is a cross-sectional view of a principal portion of the ink jet recording head. The same components in FIGS. 9 to 11 as in FIGS. 1 to 3 are denoted by the same reference numerals and will not be further described.

An ink jet recording head according to the present embodiment has the same structure as in the first embodiment except that a lower electrode film 60A constitutes a common electrode and upper electrode films 80A constitute individual electrodes in a piezoelectric element 300.

As illustrated in FIG. 9, a lower electrode film 60A constitutes a common electrode of the piezoelectric elements 300. Branches of the lower electrode film 60A extend from each end of pressure generating chambers 12 in the longitudinal direction onto surrounding walls in regions opposite the pressure generating chambers 12. The branches of the lower electrode film 60A have a smaller width than the pressure generating chambers 12. The branches of the lower electrode film 60A are connected to lead electrodes 91 on the surrounding walls. The ends of the branches of the lower electrode film 60A adjacent the other ends of the pressure generating chambers 12 in the longitudinal direction are disposed in regions opposite the pressure generating chambers 12.

As illustrated in FIG. 10B, a piezoelectric layer 70 extends beyond both ends of a pressure generating chamber 12 in the longitudinal direction, thus completely covering the top and end faces of a lower electrode film 60A in a region opposite the pressure generating chamber 12. The lower electrode film 60A extends beyond the piezoelectric layer 70 at one end of the pressure generating chamber 12 in the longitudinal direction.

The upper electrode films 80A have a larger width than the piezoelectric layers 70 and are disposed separately in a region opposite each of the pressure generating chambers 12. Thus, the upper electrode films 80A are divided by partitions 11 between the pressure generating chambers 12, thus constituting individual electrodes of the piezoelectric elements 300. The upper electrode films 80A extend from the other ends of the pressure generating chambers 12 in the longitudinal direction onto the surrounding walls.

The upper electrode films 80A extend beyond the ends of the piezoelectric layers 70 at the other ends of the pressure generating chambers 12 in the longitudinal direction. The upper electrode films 80A are connected to the lead electrodes 91. A voltage is selectively applied to each of the piezoelectric elements 300 through the corresponding lead electrodes 90.

Also in the present embodiment, the piezoelectric elements 300 and the diaphragm 50 have satisfactory displacement characteristics, and the reduction in displacement of the piezoelectric elements 300 during their repeated operation can be minimized. Furthermore, the upper electrode films 80A covering the piezoelectric layers 70 protect the piezoelectric elements 300 from damage caused by water and other foreign substances. Hence, the ink jet recording head can be securely protected against damage of the piezoelectric layers 70 and have improved durability, independently of the structure of electrodes in the piezoelectric elements 300.

Other Embodiments

While the embodiments of the invention have been described, the invention is not limited to these embodiments.

For example, while the lower electrode film 60 has a two-layer structure composed of the electroconductive layer 61 and the orientation control layer 62 in the embodiments described above, the lower electrode film 60 may have another structure. The electroconductive layer 61 may have any structure, for example, a multilayer structure, provided that the top layer is an orientation control layer 62 formed of lanthanum nickel oxide.

Likewise, while the diaphragm 50 has a two-layer structure composed of the elastic film 51 and the insulator film 52 in the embodiments described above, the diaphragm 50 may have another structure. For example, an additional layer may be disposed between the elastic film 51 and the insulator film 52 or between the elastic film 51 and the flow passage forming substrate 10 provided that the top layer is the insulator film 52 formed of titanium oxide.

Furthermore, while the upper electrode film 80 covers the piezoelectric layer 70 to protect the piezoelectric layer 70 from damage caused by water in the first embodiment, the upper electrode film 80 may have another structure. For example, the upper electrode film 80 may be disposed only in a region opposite the lower electrode film 60. In this case, a portion of the piezoelectric layer 70 not covered with the upper electrode film 80 may be covered with a protective film formed of a moisture-resistant material, such as aluminum oxide, to protect the piezoelectric layer 70 from damage caused by water.

Figure 12:
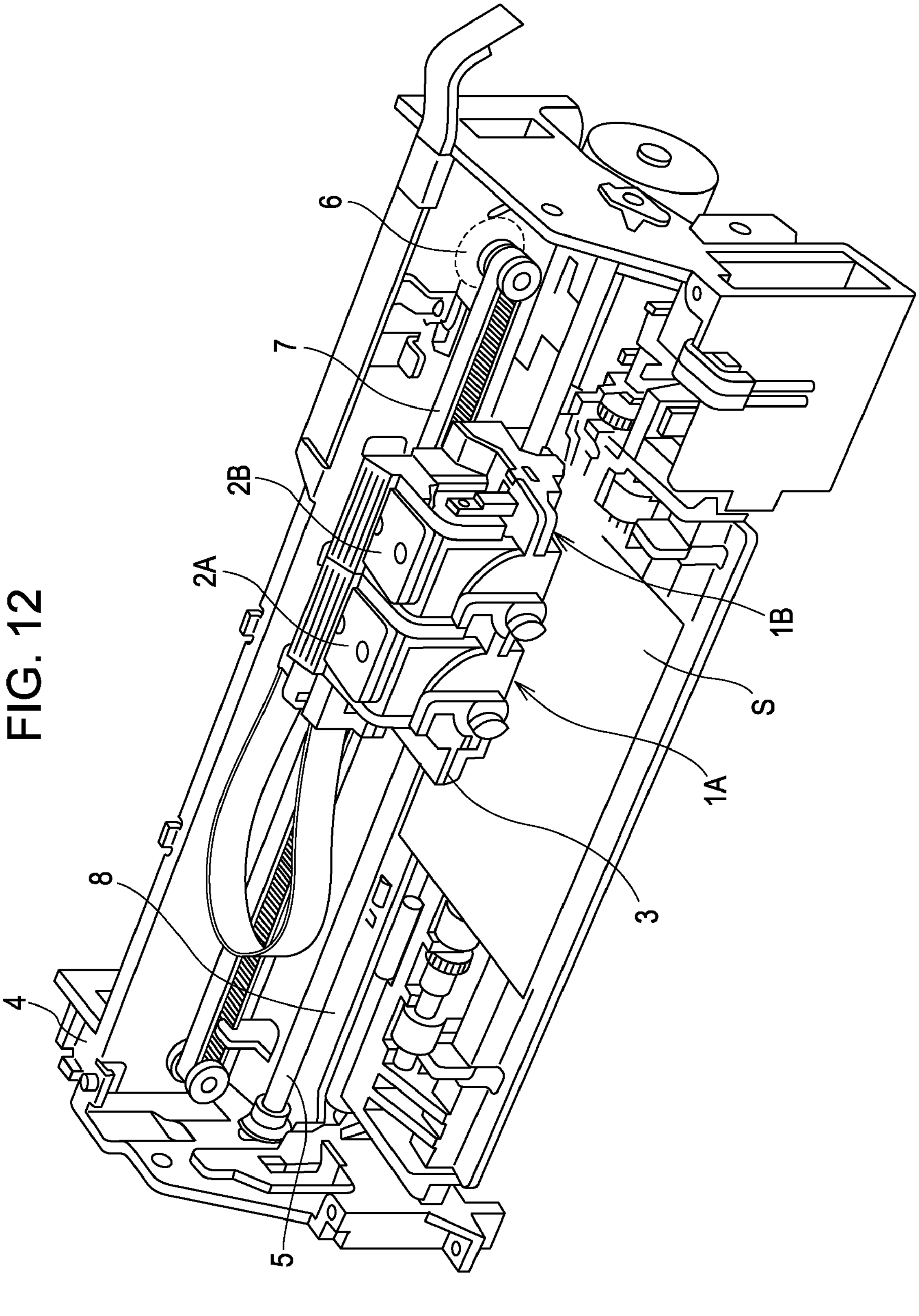
FIG. 12 is a schematic view of a recording apparatus according to an embodiment of the invention.

The ink jet recording head according to any one of the embodiments described above can be installed in an ink jet recording apparatus as one component of a recording head unit that includes an ink path in communication with an ink cartridge. FIG. 12 is a schematic view of an ink jet recording apparatus according to an embodiment of the invention. Recording head units 1A and 1B, which include an ink jet recording head, house removable cartridges 2A and 2B, which constitute an ink supply unit. A carriage 3, which includes the recording head units 1A and 1B, is mounted on a carriage shaft 5 attached to a main body 4 of the apparatus. The carriage 3 can move in the axial direction. For example, the recording head units 1A and 1B eject a black ink composition and a color ink composition, respectively. When the driving force of a drive motor 6 is transferred to the carriage 3 via a plurality of gears (not shown) and a timing belt 7, the carriage 3 including the recording head units 1A and 1B is moved along the carriage shaft 5. The main body 4 of the apparatus includes a platen 8 along the carriage shaft 5. A recording sheet S, which is a recording medium, such as paper, fed by a feed roller (not shown) is transported over the platen 8.

While ink jet recording heads have been described in the embodiments described above as liquid ejecting heads according to the invention, the invention is directed to a wide variety of liquid ejecting heads and may be applied to the ejection of liquid other than ink. Examples of the liquid ejecting heads include recording heads for use in image recording apparatuses, such as a printer, coloring material ejecting heads for use in the manufacture of color filters for a liquid crystal display, electrode material ejecting heads for use in the formation of electrodes for an organic EL display and a field emission display (FED), and bioorganic compound ejecting heads for use in the manufacture of biochips.

The invention can be applied not only to an actuator installed in a liquid ejecting head, such as an ink jet recording head, but also to actuators installed in other apparatuses.

What is claimed is:

1. A liquid ejecting head comprising:

a flow passage forming substrate that includes a plurality of pressure generating chambers juxtaposed to each other and each in communication with a nozzle for ejecting droplets; and piezoelectric elements disposed on the flow passage forming substrate with a diaphragm interposed therebetween, the piezoelectric elements including a lower electrode, a piezoelectric layer, and an upper electrode, wherein the piezoelectric layer tapers downward at its ends, the lower electrode has a width smaller than the width of each of the pressure generating chambers, the piezoelectric layer has a larger width than the lower electrode, the diaphragm has a top layer formed of a titanium oxide (TiOx) insulator film, the lower electrode has a top layer formed of a lanthanum nickel oxide (LaNiyOx) orientation control layer, the piezoelectric layer is formed of columnar crystals, and one part of the piezoelectric layer disposed on the insulator film has a smaller average grain size than the other part of the piezoelectric layer disposed on the orientation control layer.

2. The liquid ejecting head according to claim 1, wherein the piezoelectric layer has a rhombohedral, tetragonal, or monoclinic crystal structure.

3. The liquid ejecting head according to claim 1, wherein the orientation control layer and at least part of the piezoelectric layer disposed on the orientation control layer are formed of perovskite crystals having a (110), (001), (111), or (113) preferred orientation.

4. The liquid ejecting head according to claim 1, wherein the end faces of the lower electrode covered with the piezoelectric layer taper downward.

5. The liquid ejecting head according to claim 1, wherein the lower electrode further comprises an electroconductive layer under the orientation control layer, the electroconductive layer being formed of a material having a resistivity lower than that of the orientation control layer.

6. The liquid ejecting head according to claim 5, wherein the electroconductive layer is covered with the orientation control layer.

7. The liquid ejecting head according to claim 5, wherein the electroconductive layer is formed of a material selected from the group consisting of metallic materials, oxides of metallic materials, and alloys thereof.

8. The liquid ejecting head according to claim 7, wherein the metallic materials contain at least one element selected from the group consisting of copper, aluminum, tungsten, platinum, iridium, ruthenium, silver, nickel, osmium, molybdenum, rhodium, titanium, magnesium, and cobalt.

9. The liquid ejecting head according to claim 1, wherein the piezoelectric layer is mainly composed of lead zirconium titanate (PZT).

10. The liquid ejecting head according to claim 1, wherein the end faces of the piezoelectric layer are covered with a moisture-resistant protective film.

11. The liquid ejecting head according to claim 1, wherein the end faces of the piezoelectric layer are covered with the upper electrode.

12. The liquid ejecting head according to claim 11, wherein the lower electrodes are individually disposed on each of the pressure generating chambers as individual electrodes of the piezoelectric element, and the upper electrode is continuously disposed over the pressure generating chambers as a common electrode of the piezoelectric element.

13. A liquid ejecting apparatus comprising a liquid ejecting head according to claim 1.

14. An actuator comprising:

a diaphragm disposed on a substrate; and a piezoelectric element disposed on the diaphragm, the piezoelectric element including a lower electrode, a piezoelectric layer, and an upper electrode, wherein the piezoelectric layer tapers downward at its ends, the piezoelectric layer has a larger width than the lower electrode to cover end faces of the lower electrode, the diaphragm has a top layer formed of a titanium oxide (TiOx) insulator film, the lower electrode has a top layer formed of a lanthanum nickel oxide (LaNiyOx) orientation control layer, the piezoelectric layer is formed of columnar crystals, and one part of the piezoelectric layer disposed on the insulator film has a smaller average grain size than the other part of the piezoelectric layer disposed on the orientation control layer.

* * * * *